United States Patent
Satou et al.

(10) Patent No.: US 9,641,180 B2
(45) Date of Patent: May 2, 2017

(54) RECONFIGURABLE SEMICONDUCTOR DEVICE

(71) Applicant: Taiyo Yuden Co., Ltd., Tokyo (JP)

(72) Inventors: Masayuki Satou, Tokyo (JP); Isao Shimizu, Saitama (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/133,863

(22) Filed: Apr. 20, 2016

(65) Prior Publication Data
US 2016/0322974 A1    Nov. 3, 2016

(30) Foreign Application Priority Data

Apr. 28, 2015  (JP) ................. 2015-090915

(51) Int. Cl.
| | |
|---|---|
| H03K 19/17 | (2006.01) |
| H03K 19/177 | (2006.01) |
| G11C 8/10 | (2006.01) |
| G11C 7/00 | (2006.01) |

(52) U.S. Cl.
CPC ........... *H03K 19/1776* (2013.01); *G11C 7/00* (2013.01); *G11C 8/10* (2013.01); *H03K 19/17728* (2013.01)

(58) Field of Classification Search
CPC ............ G06F 15/7867; G06F 17/5054; G01R 31/3167; H03K 19/17796; H03K 19/017581; H03K 19/02; H03K 19/1776; H03K 19/17728; H03M 1/005; H03M 1/124; H03M 3/30; H03M 3/398; H03M 3/458; G11C 7/00; G11C 8/10
See application file for complete search history.

(56) References Cited

U.S. PATENT DOCUMENTS

| | | | |
|---|---|---|---|
| 5,196,740 A | 3/1993 | Austin | |
| 6,279,045 B1 * | 8/2001 | Muthujumaraswathy | G06F 15/7867 710/5 |
| 6,864,822 B2 * | 3/2005 | Gulati | H03M 1/005 341/143 |
| 6,956,512 B1 * | 10/2005 | San | H03K 19/17732 324/607 |
| 7,321,327 B1 * | 1/2008 | San | H03M 1/1038 341/118 |
| 7,825,688 B1 | 11/2010 | Snyder et al. | |

(Continued)

FOREIGN PATENT DOCUMENTS

| | | |
|---|---|---|
| JP | 5-175466 A | 7/1993 |
| JP | 2013-219699 A | 10/2013 |

*Primary Examiner* — Vibol Tan
(74) *Attorney, Agent, or Firm* — Chip Law Group

(57) ABSTRACT

There is provided a reconfigurable semiconductor device including a plurality of circuit blocks each including a reconfigurable logic unit, and an analog circuit configured to convert an analog signal from the outside into a digital signal to output the digital signal to the reconfigurable logic unit, and convert a digital signal outputted from the reconfigurable logic unit into an analog signal to output the analog signal to the outside. The circuit block has a rectangular shape, is connected to the two adjacent circuit blocks from one side with a plurality of analog lines, and is connected to the other two adjacent circuit blocks from the other side on a side opposite to the one side with a plurality of analog lines.

8 Claims, 11 Drawing Sheets

(56) References Cited

U.S. PATENT DOCUMENTS

| | | | | |
|---|---|---|---|---|
| 8,082,284 B2* | 12/2011 | Leijten-Nowak | .. | H03K 19/1737 |
| | | | | 708/235 |
| 8,487,655 B1* | 7/2013 | Kutz | ................... | H03K 19/173 |
| | | | | 326/82 |
| 8,656,065 B1* | 2/2014 | Gerhart | ................ | G06F 13/385 |
| | | | | 370/236 |
| 8,717,070 B1* | 5/2014 | Klein | ................... | H03F 3/45475 |
| | | | | 327/108 |
| 9,287,877 B2* | 3/2016 | Satou | ............... | H03K 19/17732 |
| 9,425,798 B2* | 8/2016 | Satou | ................... | H03K 19/177 |
| 2009/0282213 A1* | 11/2009 | Tanaka | ............ | H03K 19/17728 |
| | | | | 712/15 |
| 2015/0022232 A1 | 1/2015 | Satou et al. | | |

* cited by examiner

| A0 | A1 | A2 | A3 | C0 | D1 | D2 | D3 |
|----|----|----|----|----|----|----|----|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

A0 → D1
A1 → D2
A2 → D3
A3 → D0

| A0 | A1 | A2 | A3 | D0 | D1 | D2 | D3 |
|----|----|----|----|----|----|----|----|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |

| A0 | A1 | A2 | A3 | D0 | D1 | D2 | D3 |
|---|---|---|---|---|---|---|---|
| 0 | 0 | 0 | 0 | 1 | * | 0 | * |
| 1 | 0 | 0 | 0 | 1 | * | 0 | * |
| 0 | 1 | 0 | 0 | 1 | * | 0 | * |
| 1 | 1 | 0 | 0 | 1 | * | 0 | * |
| 0 | 0 | 1 | 0 | 0 | * | 0 | * |
| 1 | 0 | 1 | 0 | 1 | * | 0 | * |
| 0 | 1 | 1 | 0 | 1 | * | 0 | * |
| 1 | 1 | 1 | 0 | 1 | * | 0 | * |
| 0 | 0 | 0 | 1 | 1 | * | 1 | * |
| 1 | 0 | 0 | 1 | 1 | * | 1 | * |
| 0 | 1 | 0 | 1 | 1 | * | 1 | * |
| 1 | 1 | 0 | 1 | 1 | * | 1 | * |
| 0 | 0 | 1 | 1 | 0 | * | 1 | * |
| 1 | 0 | 1 | 1 | 1 | * | 1 | * |
| 0 | 1 | 1 | 1 | 1 | * | 1 | * |
| 1 | 1 | 1 | 1 | 1 | * | 1 | * |

RECONFIGURABLE SEMICONDUCTOR DEVICE

CROSS REFERENCE TO RELATED APPLICATION(S)

This application is based upon and claims benefit of priority from Japanese Patent Application No. 2015-090915, filed on Apr. 28, 2015, the entire contents of which are incorporated herein by reference.

BACKGROUND

The present invention relates to a reconfigurable semiconductor device.

In recent years, with further miniaturization and higher integration of a semiconductor device, it has become common to produce a system-on-a-chip (SoC) formed by integrating a semiconductor device with an analog circuit on one large scale integrated circuit (LSI), in place of a printed circuit board on which a semiconductor device and an analog circuit are provided separately. Compared with the printed circuit board having a plurality of single-function LSIs mounted thereon, the SoC has a number of advantages such as a reduction in occupied area on the printed circuit board, an increase in speed, low power consumption, and a reduction in cost.

For example, there has been proposed a system-on-a-chip including a hard macro block, a power control unit, and a multi-threshold CMOS logic circuit (see JP 2013-219699A). The system-on-a-chip can reduce a leakage current of the whole system-on-a-chip by bringing the hard macro block into a power-off state.

In addition, there has been proposed a semiconductor device capable of configuring an analog circuit (see JP H5-175466A). Furthermore, "PSoC (registered trademark)" is known as a commercialized reconfigurable analog device (see U.S. Pat. No. 7,825,688).

SUMMARY

In recent years, a reconfigurable device such as a field-programmable gate array (FPGA) is increasingly becoming finer. Since an analog circuit is difficult to reduce in size due to the need for a higher operation voltage and current than that of a semiconductor device, the FPGA or the like with advanced miniaturization may prevent the analog circuit from being mounted on the same chip to entail a preparation of the analog circuit out of the chip. On the other hand, when a system including the semiconductor device and the analog circuit is formed into one chip as with the case of the SoC or the like, circuit design of the whole SoC may be needed to revise the analog circuit or the like.

While the PSoC (registered trademark) allows the analog circuit to be reconfigured, its structure having the analog circuit separately from a flash memory may restrict reconfigurability of the analog circuit. Further, the semiconductor integrated circuit disclosed in JP H5-175466A uses an analog switch for connection. The analog switch in which a large amount of current flows may occupy a large chip area, and may be hardly realized for a large-scale integrated circuit.

According to an embodiment solving the above-described issues, as shown in the following item sets, it is possible to provide a large variety of analog circuits by alternately arranging a large number of reconfigurable devices and circuit units each having an analog circuit.

1. According to an embodiment of the present invention, there is provided a reconfigurable semiconductor device including a plurality of circuit blocks each including a reconfigurable logic unit, and an analog circuit configured to convert an analog signal from the outside into a digital signal to output the digital signal to the reconfigurable logic unit, and convert a digital signal outputted from the reconfigurable logic unit into an analog signal to output the analog signal to the outside, wherein the circuit block has a rectangular shape, is connected to the two adjacent circuit blocks from one side with a plurality of analog lines, and is connected to the other two adjacent circuit blocks from the other side on a side opposite to the one side with a plurality of analog lines.

2. The reconfigurable semiconductor device according to item 1, wherein the analog circuit includes an A/D conversion circuit configured to convert an analog signal into a digital signal to output the digital signal to the reconfigurable logic unit, a D/A conversion circuit configured to convert a digital signal outputted from the reconfigurable logic unit into an analog signal to output the analog signal, and an operational amplifier arranged at an output of the D/A conversion circuit, wherein the analog line is a force line, and wherein the circuit block is connected to another circuit block with a force line arranged at an output of the operational amplifier, and connected to the another circuit block with a sense line configured to feed back an analog signal outputted from the force line to the operational amplifier, and the analog signal is inputted from the force line.

3. The reconfigurable semiconductor device according to item 1, wherein the reconfigurable logic unit includes a memory cell unit configured to store configuration data, and an address decoder configured to decode an address signal to output the decoded signal to the memory cell unit.

4. The reconfigurable semiconductor device according to item 3, wherein the circuit block is further connected to the two adjacent circuit blocks from one side with a plurality of digital signal connection lines, and connected to the other two adjacent circuit blocks from the other side on a side opposite to the one side with a plurality of digital signal connection lines.

5. The reconfigurable semiconductor device according to item 4, wherein address lines inputted to the address decoder included in the circuit block are connected to data lines of a memory cell block included in the adjacent circuit block, as the digital signal connection lines.

6. The reconfigurable semiconductor device according to item 1, wherein the reconfigurable logic unit is an FPGA.

7. The reconfigurable semiconductor device according to item 3, wherein the configuration data is truth table data, and the memory cell unit operates as a connection element and/or a logic element according to the truth table data.

According to an embodiment of the present invention, a reconfigurable analog circuit is provided.

DETAILED DESCRIPTION OF THE EMBODIMENT(S)

Figure 1:
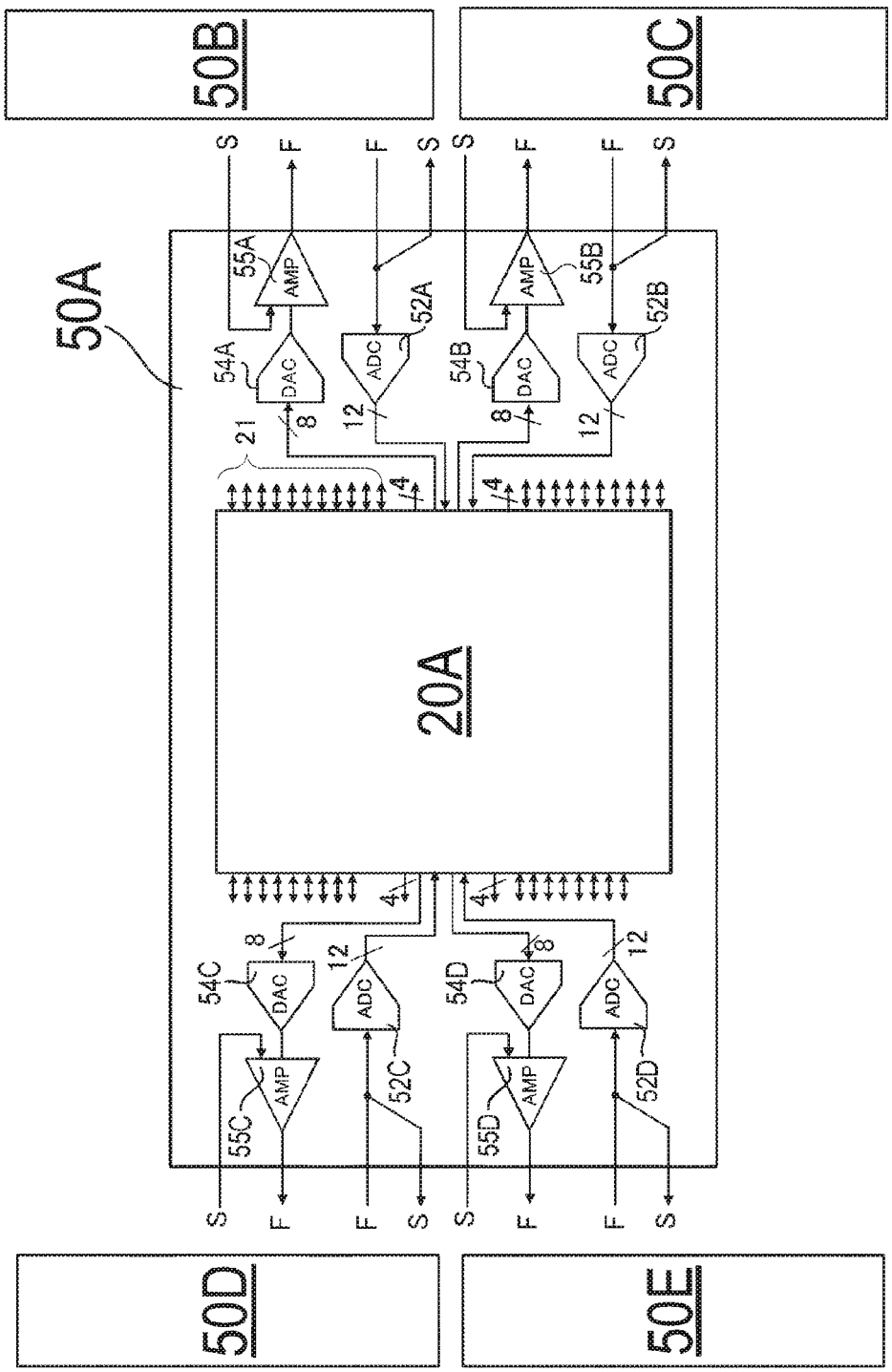
FIG. 1 is a diagram illustrating one example of a circuit block according to an embodiment of the present invention.

Hereinafter, referring to the appended drawings, preferred embodiments of the present invention will be described in detail. It should be noted that, in this specification and the appended drawings, structural elements that have substantially the same function and structure are denoted with the same reference numerals, and repeated explanation thereof is omitted.

Hereinafter, with reference to the drawings, a reconfigurable semiconductor device will be discussed based on the following configuration. The description will be provided in the order of 1. Reconfigurable Semiconductor Device, 2. Logic Unit, and 3. Configuration Data.

1. Reconfigurable Semiconductor Device

A reconfigurable semiconductor device 1 according to an embodiment of the present invention includes a plurality of circuit blocks 50. The circuit block 50 has a reconfigurable logic unit 20 (hereinafter referred to as merely a "logic unit 20"), an analog/digital conversion circuit (ADC) 52 that converts an analog signal into a digital signal to output the digital signal to the logic unit 20, a digital/analog conversion circuit (DAC) 54 that converts a digital signal outputted from the logic unit 20 into an analog signal to output the analog signal, and an operational amplifier (AMP) 55 that is arranged at an output of the digital/analog conversion circuit (DAC) 54. The circuit block 50 has a rectangular shape, is connected to two adjacent circuit blocks 50 from one side with a plurality of analog lines, and is connected to the other two adjacent circuit blocks 50 from the other side on a side opposite to the one side with a plurality of analog lines. The semiconductor device 1 can constitute a reconfigurable analog circuit since the logic unit 20 is reconfigurable by configuration data.

Note that the reconfigurable semiconductor device 1 according to an embodiment of the present invention can realize a large-scale analog circuit such as a graphic equalizer, an audio music synthesizer, an audio mixer desk, a special filter, a spectrum analyzer, a signal generator, and a lowest frequency linear integrated circuit switch.

The reconfigurable semiconductor device 1 can realize the large-scale analog circuit, as described above, composed of a set of a plurality of analog circuits by connecting the circuit blocks 50 each capable of realizing an analog circuit with analog lines. On the other hand, such a configuration that a plurality of FPGAs are combined and analog circuits are provided in the periphery thereof may allow analog input/output, but may require integrated circuits for use in most of the large-scale analog circuit, making it difficult to realize the propagation of analog signals within the integrated circuits. Accordingly, it may be impossible to emulate an analog circuit.

The logic unit 20 will be discussed in "2. Logic Unit".

1.1 Circuit Block

FIG. 1 is a diagram illustrating one example of a circuit block according to an embodiment of the present invention. A circuit diagram of a configuration example of the circuit block 50 is illustrated. Each circuit block 50 includes the analog/digital conversion circuit (ADC) 52 that converts an analog input signal into a digital signal, the logic unit 20 that calculates a desired output value based on the digital signal to output the output value, the digital/analog conversion circuit (DAC) 54 that converts the calculated result at the logic unit 20 into an analog signal, and the operational amplifier (AMP) 55 that amplifies the analog-converted analog signal. In the circuit block 50 according to an embodiment of the present invention, the DAC 54, the ADC 52 and the AMP 55 are configured as an analog circuit, and the analog circuit is configured by allowing the logic unit to configure, for example, a mathematical model of a transfer function F(s).

Digital signal lines inputted/outputted to/from the logic unit 20 are used as digital signal lines of the DAC 54 and the ADC 52. In the example shown in FIG. 1, the DAC 54 has 8 bits and the ADC 52 has 12 bits. Digital outputs of the ADC 52 are inputted as "address lines of an AD pair (see FIG. 8)" of the logic unit 20. Digital inputs of the DAC 54 are outputted as "output data lines of an AD pair (see FIG. 8)" of the logic unit 20. While the number of the data lines connected to the analog signal via the DAC 54 is 8, the number of the address lines connected via the ADC 52 is 12. Four (4-bit) data lines not configuring the AD pairs are used as switch control lines to be described using FIG. 2A. Note that the number of bits of the ADC 52 is made larger than that of the DAC 54 to prevent deterioration in accuracy due to a bit lack.

Figure 2A:
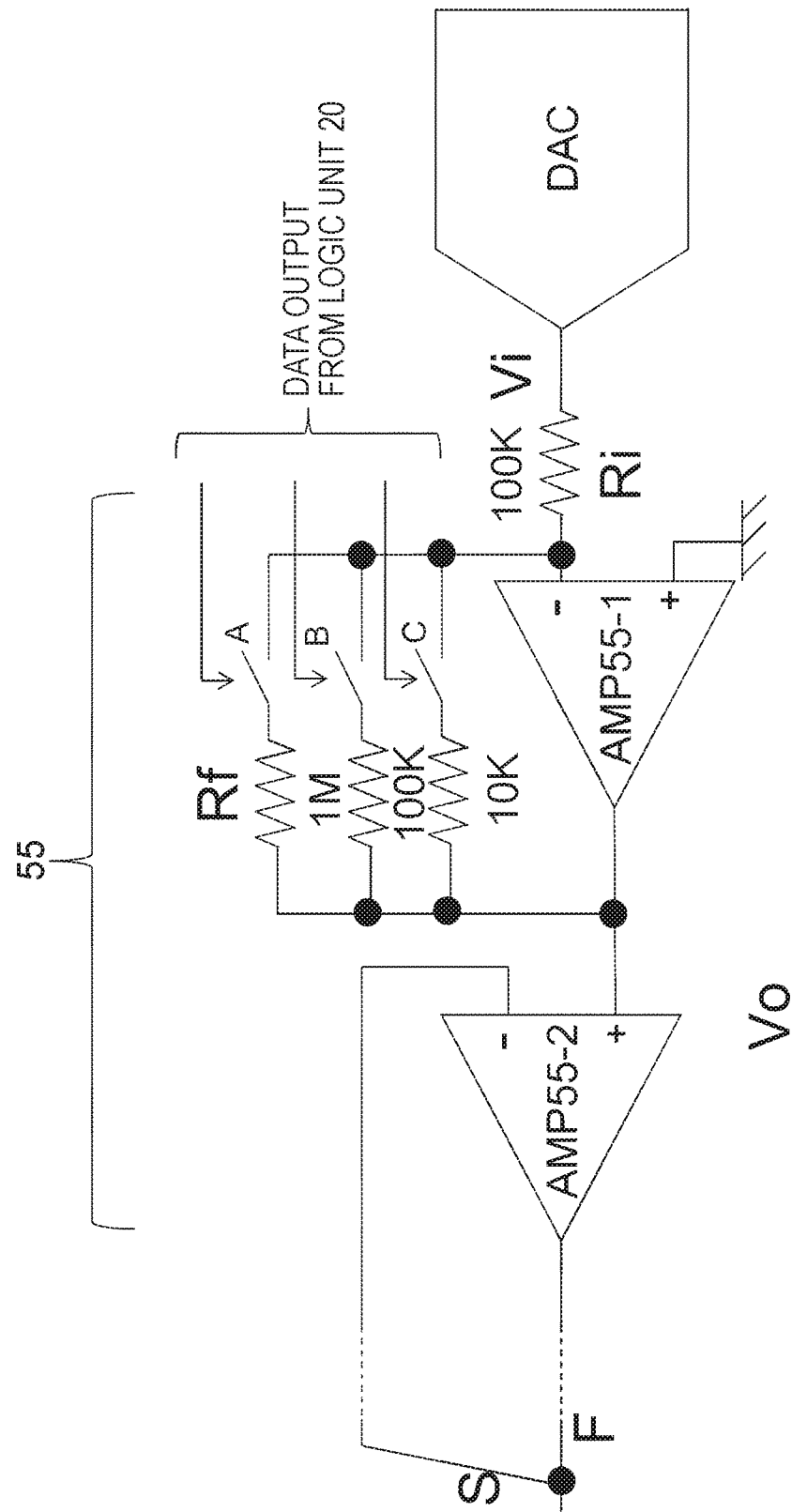
FIG. 2A is a diagram illustrating a detailed example of an AMP circuit.

FIG. 2A is a diagram illustrating a detailed example of an AMP. The AMP 55 includes two AMPs 55-1 and 55-2. In FIG. 2A, an input voltage Vo of the AMP 55-2 is expressed using an output voltage Vi of the DAC 54 and resistors Rf and Ri in the following formula.

$$Vo = -(Rf/Ri) \times Vi$$

The 4-bit data lines outputted from the logic unit 20 can be used as control signals for switches A, B and C provided in feedback lines of the AMP 55-1 to change a gain of the AMP. When the switch A is turned on, the voltage Vo becomes 10 times, when the switch B is turned on, the voltage Vo becomes 1 time, and when the switch C is turned on, the voltage Vo becomes 1/10 times. The 4-bit corresponds to provision of a margin increased by 16 times, resulting in provision of an analog margin of about 20 dB.

The AMP 55 takes a form of a voltage follower circuit, and facilitates mounting of a semiconductor through an approach using no high resistance as a differential amplification apparatus.

Returning now to FIG. 1, the configuration example of the circuit block 50 will be discussed. A circuit block 50A is connected to other circuit blocks 50B to 50E with force lines F at outputs of the operational amplifiers 55. Further, the circuit block 50A is connected to the other circuit blocks 50B to 50E with sense lines S feeding back analog signals outputted from the force lines F to the operational amplifiers 55. The analog signals are inputted from the force lines F.

On an inlet side of the ADC 52 within the circuit block 50A, the force lines F and the sense lines S are connected to each other with Kelvin contact. The connected sense lines are used as feedback lines of the operational amplifiers 55 in the other circuit blocks.

In this manner, when the sense lines S are provided separately from the force lines F, and signals at the input terminals of the circuit block at the next stage are fed back to the operational amplifier 55 in the circuit block at the previous stage, it is possible to prevent input signals of the circuit block at the next stage from exhibiting an error due to parasitic resistance that may be possibly contained in the force lines F.

That is, when the output terminal of the operational amplifier 55 is connected to one of the input terminals directly or via the resistor to form a feedback loop within each circuit block 50, it may be impossible to transmit a correct input signal to the circuit block at the next stage when a distance to the circuit block at the next stage is long and parasitic resistance of the force line F is too large to be ignorable. On the other hand, when the sense line S is provided to feed back a signal at the input terminal of the circuit block at the next stage to the operational amplifier 55 in the circuit block at the previous stage, the operational amplifier 55 operates so as to make the input signal of the circuit block at the next stage matched with a signal at the other input terminal (a signal from the DAC 54), thereby preventing the input signal of the circuit block at the next stage from exhibiting an error due to parasitic resistance of the force line F.

Note that, as shown in FIG. 1, the configuration of the ADC 52, the DAC 54 and the AMP 55 is provided for each of the other circuit blocks to be connected. The force line and the sense line are connected to each other so as to form a pair of a transmitting line and a receiving line in the adjacent circuit block. This allows an analog signal free from an error due to parasitic resistance to be transmitted.

Note that a reference numeral 21 is connection lines of digital signals between the logic units 20. When the logic unit 20 is a memory based reconfigurable logic device (MRLD) (registered trademark), the connection lines of the digital signals of the logic unit 20 constitute AD pairs. In the reconfigurable semiconductor device 1, the logic units 20 can be connected to each other with the AD pairs to constitute a logic circuit across the plurality of logic units 20.

1.2 Alternate Arrangement

Figure 2B:
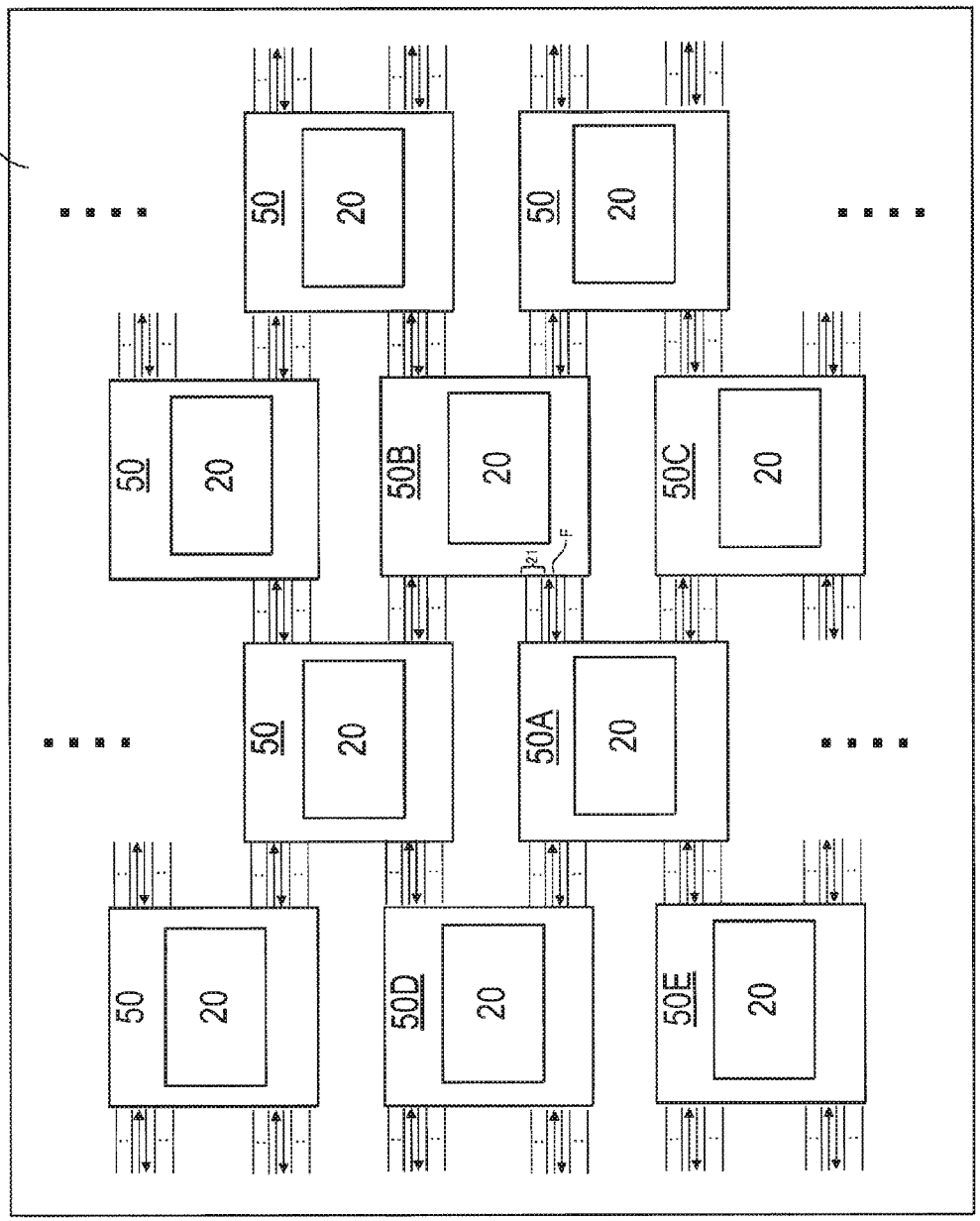
FIG. 2B is a diagram illustrating one example of an alternate arrangement of the circuit block.

FIG. 2B is a diagram illustrating one example of an alternate arrangement of the circuit block. As shown in FIG. 2B, the circuit block 50 according to an embodiment of the present invention has a rectangular shape, is connected to other circuit blocks from one side with a plurality force lines, and is connected to other circuit blocks from the other side on a side opposite to the one side with a plurality of force lines. Note that, for the digital signal connection lines 21 and the force lines F described in FIG. 1, as shown in the circuit block 50B in FIG. 2B, the lines with no arrow indicate the digital signal connection lines 21 and the arrows indicate the force lines F.

Since the circuit block 50A is connected to the adjacent other circuit blocks 50B to 50E with the plurality of force lines F, data transmitted/received to/from the adjacent circuit blocks is plural. Further, the force lines F are limited to the use for bidirectional (a right side direction and a left side direction in FIG. 2B) connection. Further, the number of the adjacent circuit blocks is not limited to two and is set to two or more in a bidirectional manner, and in order to increase the configurability, connection to two circuit blocks in each of an input direction and an output direction is possible. Hereinafter, such an arrangement method is referred to as an "alternate arrangement". This alternate arrangement may eliminate the need for a switch between the circuit blocks since the connection of the circuit block is limited. Further, the direction of data flow in the input direction and the output direction can be limited, thereby facilitating a creation of a logic library.

1.3 Number of Logic Stages for Alternate Arrangement Circuit Blocks

Figure 3:
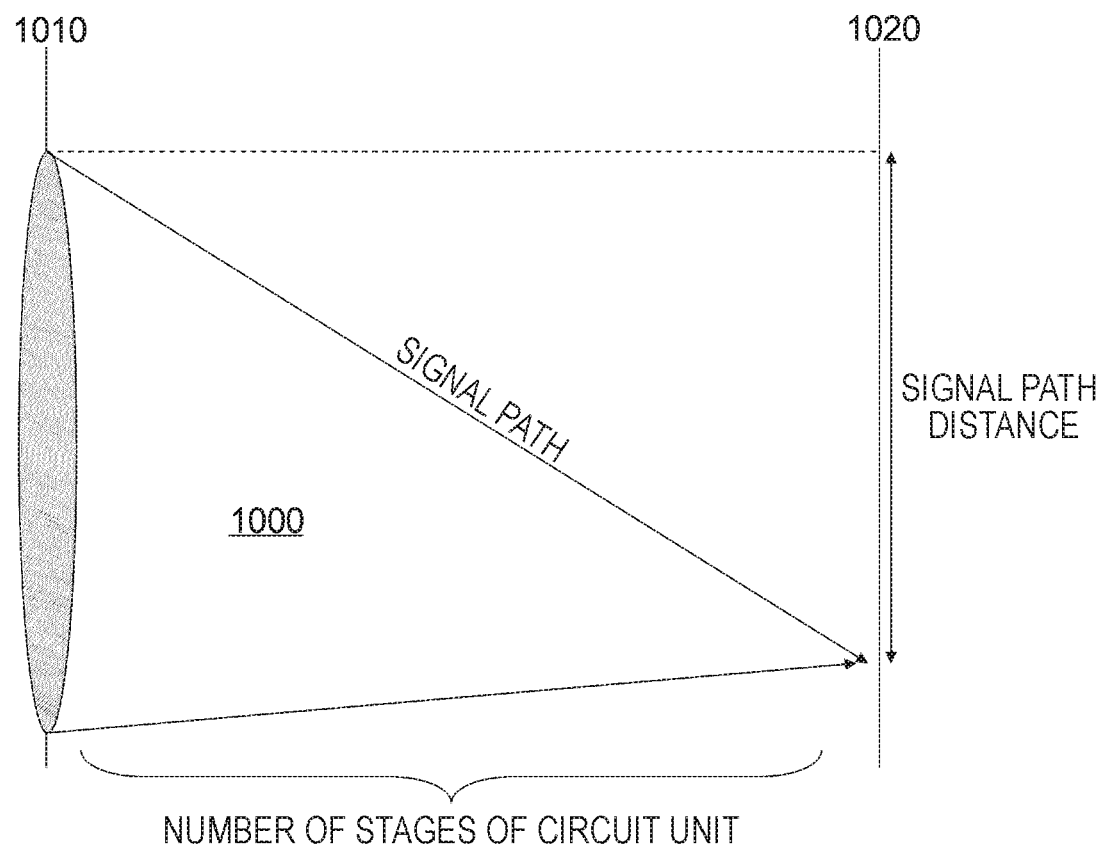
FIG. 3 is a diagram illustrating one example of a logic cone.

FIG. 3 is a diagram illustrating one example of a logic cone mounted by the plurality of circuit blocks. The logic cone refers to a circuit block group defined by all analog inputs affecting one output of the analog circuit. When certain analog signals enter an input terminal line 1010, an extent of the influence is spread to the circuit blocks at the lower stage to determine certain analog outputs at an output terminal line 1020. In this manner, a logic cone 1000 is formed.

Hereinafter, a method for determining a bidirectional circuit block for the logic cone will be discussed using definition of an n-value. The n-value will be described using the circuit blocks 50A and 50C described in FIG. 1 and FIG. 2B. The number of the digital signal connection lines 21 outputted from one side facing the adjacent circuit blocks 50A and 50C is defined as the "n-value". For example, when the number of the digital signal connection lines 21 outputted from one side is "8", the n-value is "8". In the alternate arrangement circuit block, the data transmission amount is half of the n-value in conjunction with the adjacent circuit blocks, and the number of stages obtained by dividing the signal path distance by (n-value/2) may be needed to realize the longest signal path, since the signal path is shifted by one stage. The number of logic stages of the circuit block refers to the number of stages of the circuit block for lateral arrangement for realizing a desired circuit. The number of logic stages of the circuit block is expressed by the following formula.

Number of Logic Stages of Circuit Block=$m/(n\text{-value}/2)$    Formula 1:

Here, m represents a signal path distance and indicates input data lines for the logic cone. In the example shown in FIG. 1, the n-value is "8", and the (n-value/2) is "4" since the two adjacent circuit blocks are located in one direction. When the number of the input data lines (m) for the logic cone is 8 as C-language logical calculation is conducted by 8 bits, the number of logic stages of the circuit block is 8/4=2. That is, when 8-bit calculation is conducted by the circuit blocks, two circuit blocks may be needed.

2. Logic Unit

Figure 4:
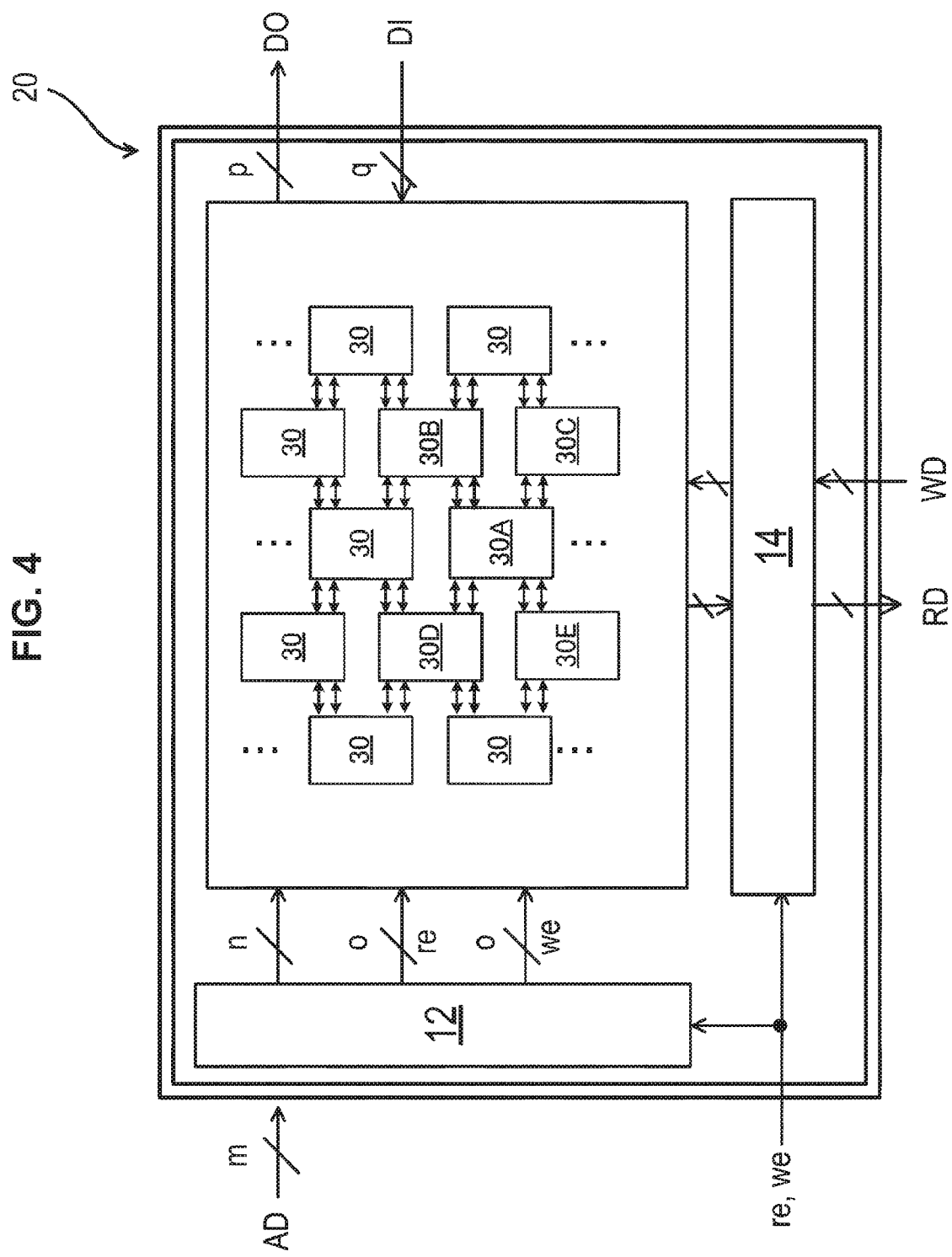
FIG. 4 is a diagram illustrating one example of a logic unit according to an embodiment of the present invention.

FIG. 4 is a block diagram illustrating the logic unit according to an embodiment of the present invention. Hereinafter, although the logic unit will be discussed based on the MRLD (registered trademark) under development by the applicant, the logic unit 20 is an example of an integrated circuit including semiconductor elements, and may be the FPGA.

The logic unit 20 has a plurality of multi look-up-tables (MLUTs) 30, and has a decoder 12 that specifies a memory reading operation and writing operation for memory cell units within the MLUT 30, and an input/output unit 14.

The logical operation of the logic unit 20 uses a signal of a data input DI and a data output DO indicated by the solid line. The writing operation of the logic unit 20 is performed by an address for writing AD and data for writing WD, and the reading operation is performed by the address for writing AD and data for reading RD.

The address for writing AD is an address that specifies the memory cell in the MLUT 30. The address for writing AD specifies 2 raised to the m-th power n memory cells by means of m signal lines. The address for writing AD is used in both cases of the reading operation and the writing operation of the memory, is decoded by the decoder 12 via the m signal lines, and selects the memory cell as an object. In the embodiment, as described later, the decoding of the data input DI is performed by a decoder in the MLUT 30.

The decoder 12 decodes the address for writing AD in accordance with control signals such as a read enable signal re and a write enable signal we, and outputs a decoded address n to the MLUT 30. The decoded address n is used as an address that specifies the memory cell in the configuration memory of the MLUT 30.

The input/output unit 14 writes the data for writing WD according to a write enable signal we, and outputs the data for reading RD according to a read enable signal re.

The MLUT 30 includes the memory cell units. Each storage element of the memory stores data considered as a truth table, so that the MLUT 30 performs a logical operation as a logic element or a connection element, or a logic element and a connection element.

In the logical operation of the MLUT 30, the MLUT 30 uses a signal of an address for logic LA (shown in FIG. 7) and data for logic LD (shown in FIG. 7) indicated by the solid line. The address for logic LA is used as an input signal of the logic circuit, and the data for logic LD is used as an output signal of the logic circuit. The address for logic LA of the MLUT 30 is connected to a data line of the data for logic LD of the adjacent MLUT.

The logic realized by the logical operation of the logic unit 20 is realized by truth table data stored in the MLUT 30. Some MLUTs 30 operate as a logic element serving as a combinational circuit of an AND circuit, an adder, and the like. The other MLUTs 30 operate as a connection element that makes a connection between the MLUTs 30 that create the combinational circuit. The rewriting of the truth table data for the MLUT 30 to realize the logic element and the connection element is performed by the writing operation to the memory.

Figure 5:
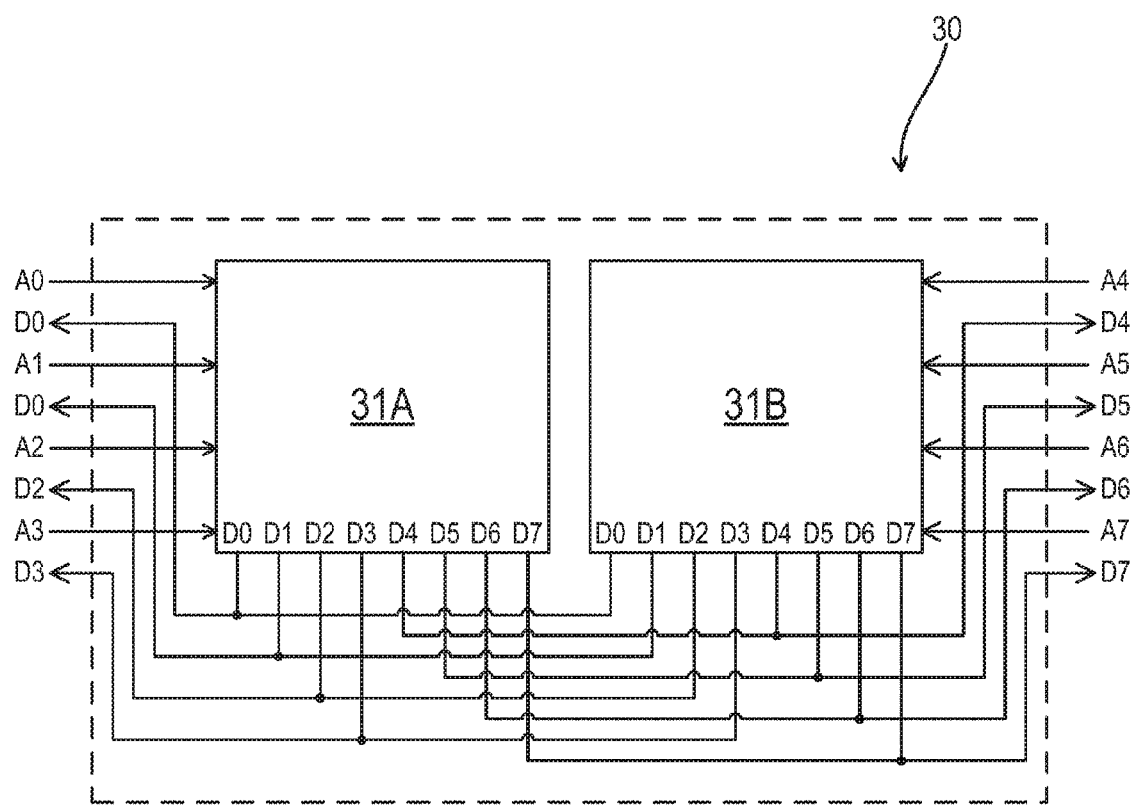
FIG. 5 is a diagram illustrating a circuit example of an MLUT.

FIG. 5 is a diagram illustrating a circuit example of the MLUT. The MLUT 30 shown in FIG. 5 has memory cell units 31A and 31B. The memory cell unit is, for example, a static random access memory (SRAM). As shown in FIG. 5, the memory cell unit 31A has a plurality of memory cells that are specified by a plurality of address lines for logic A0 to A3 from one side to output to a plurality of data lines D0 to D7 twice as many as the plurality of address lines for logic, and the memory cell unit 31B has a plurality of memory cells that are specified by a plurality of address lines for logic A4 to A7 from the other side to output to a plurality of data lines D0 to D7 twice as many as the plurality of address lines for logic. The MLUT 30 outputs one portion of the plurality of data lines to one side and outputs the other portion of the plurality of data lines to the other side.

Each memory cell unit stores truth table data for each one direction in the memory cells. Therefore, each of the memory cell units 31A and 31B stores truth table data for a direction from right to left and truth table data for a direction from left to right. That is, the MLUT stores two truth table data each specifying a specific data output direction.

When the number of data of each memory cell unit is made greater than the number of addresses and the direction of data output from each memory cell unit is made bidirectional, the MLUT according to an embodiment of the present invention allows the number of necessary memory cells to be reduced and the bidirectional data output to be realized.

Figure 6:
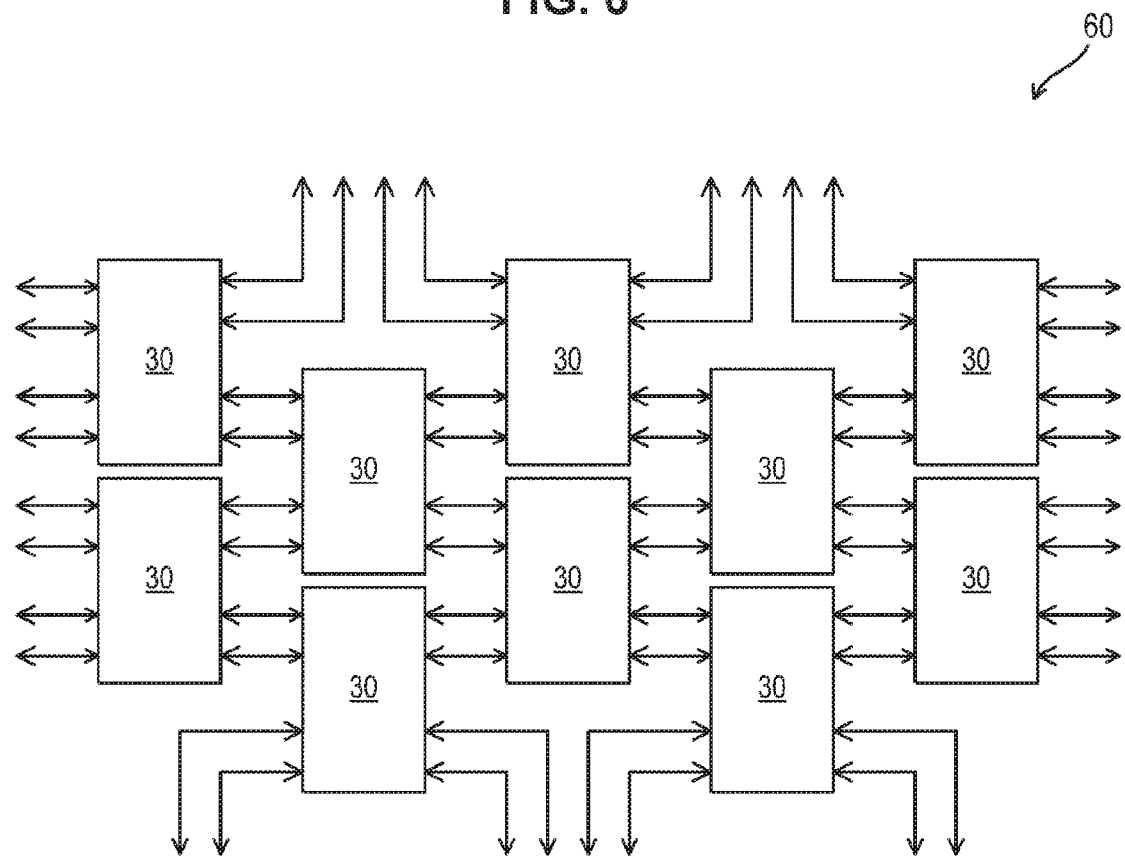
FIG. 6 is a diagram illustrating one example of an arrangement of a plurality of MLUTs.

FIG. 6 is a diagram illustrating one example of an arrangement of a plurality of MLUTs. As shown in FIG. 6, the array arrangement of the MLUTs 30 allows the circuit scale to be expanded.

Figure 7:
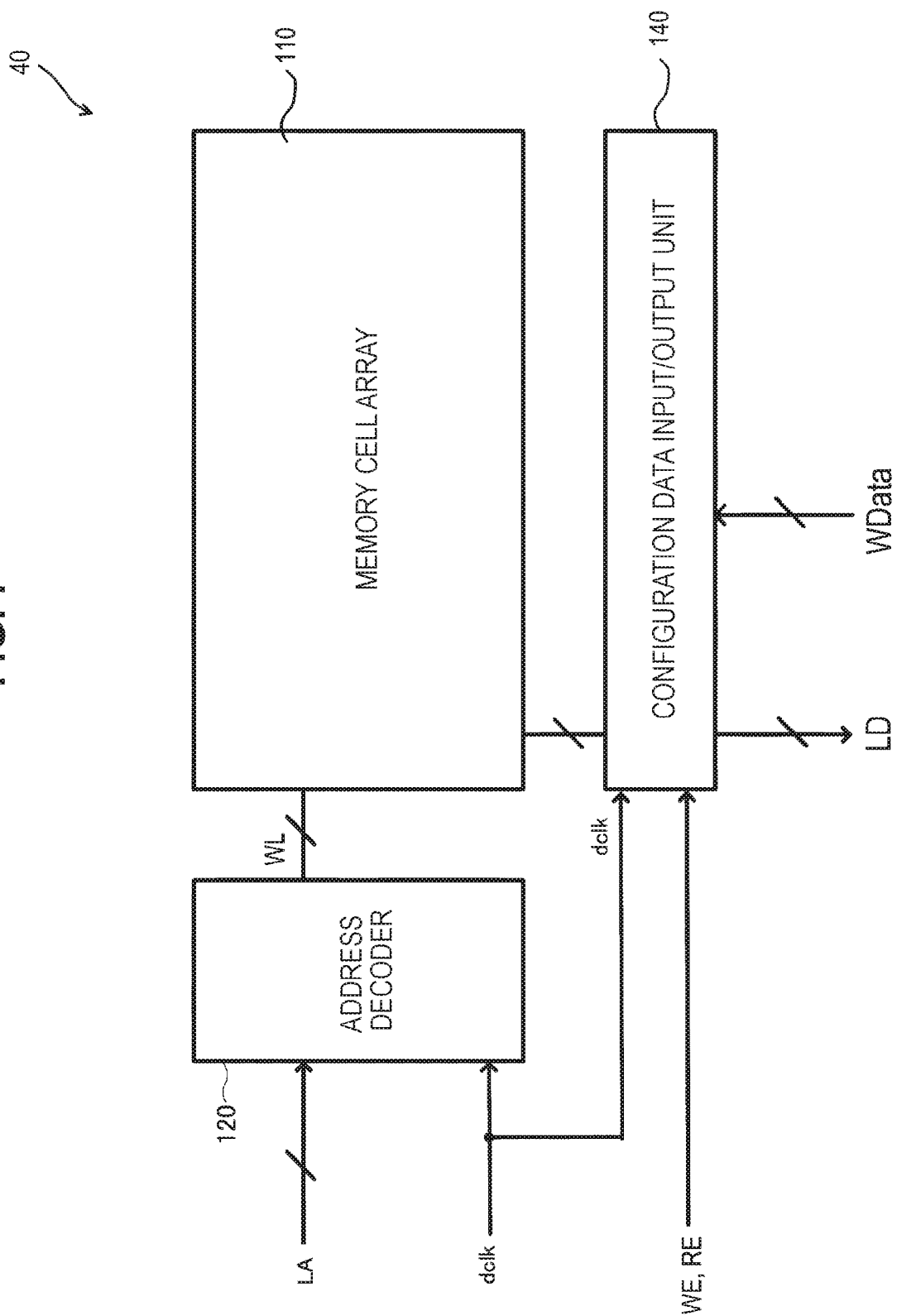
FIG. 7 is a diagram illustrating a detail of a configuration memory.

FIG. 7 is a diagram illustrating a detail of a configuration memory. A configuration memory 40 included in the MLUT 30 is, for example, a SRAM, and is a synchronous memory operating in synchronization with a clock. The configuration memory 40 is connected to the address lines for logic LA for specifying the memory cells that store configuration data therein. Note that the address lines for logic LA, when the writing operation to the configuration memory is performed, are used as address lines for specifying the memory cells to be written.

A memory cell array 110 has n×2m of memory cells (and storage elements associated with the memory cells), and the memory cells are arranged at connection portions between 2 raised to the m-th power of word lines and n bit lines (hereinafter referred to also as "data lines").

An address decoder 120, when receiving address signals from m address signal lines in synchronization with a clock (dclk), decodes the address signals to output word line selection signals as decoded signals to 2 raised to the m-th power of word lines WL, so that reading or writing processing of data for the corresponding memory cells is performed.

A configuration data input/output unit 140 has a write amplifier, and a sense amplifier as needed. The write amplifier, for example, when receiving rising edge timing of a write enable (WE) and writing data from the outside, transmits a signal level of the writing data to the n bit lines to write the data to the memory cells.

Note that the logic unit 20 may be the FPGA. When the logic unit 20 is the MRLD, the AD pair connection is possible, but when it is the FPGA, it may be only possible to deliver a signal between the inside of the FPGA and an external circuit, and it may be impossible to constitute the logic circuit using a plurality of FPGAs.

3. Configuration Data

Figure 8:
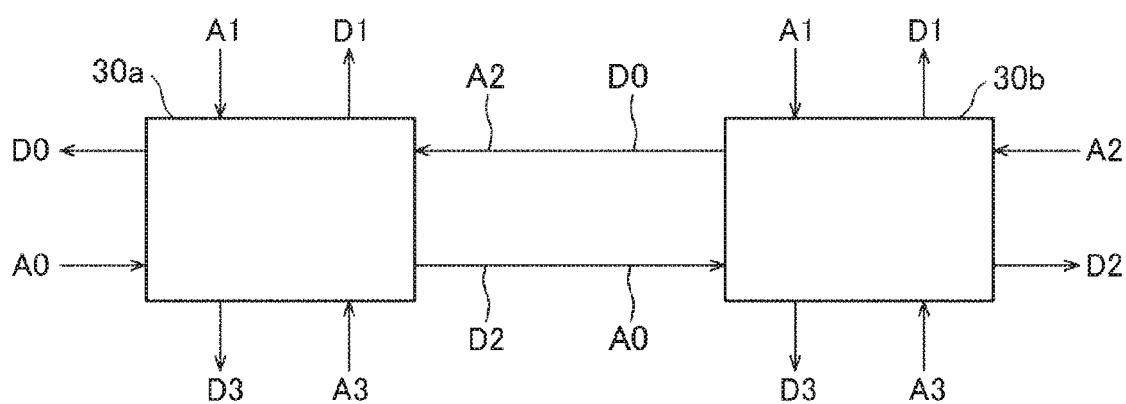
FIG. 8 is a diagram illustrating one example of the MLUT.

Hereinafter, the configuration data will be discussed using an example. FIG. 8 is a diagram illustrating one example of the MLUT. MLUTs 30a and 30b shown in FIG. 8 are connected to four address input lines for logic A0 to A3 and four data lines for logical operation D0 to D3. The address input line for logic A2 of the MLUT 30a is connected to the data line for logical operation D0 of the adjacent MLUT 30b, and the MLUT 30a receives data for logical operation outputted from the MLUT 30b as address inputs for logic. The data line for logical operation D2 of the MLUT 30a is connected to the address input line for logic A0 of the MLUT 30b, and data for logical operation outputted by the MLUT 30a is received as address inputs for logic by the MLUT 30*b*. Such a connection between the MLUTs is referred to as an "AD pair" since the address line and the data line forming a pair are used. The configuration data (truth table data) for realizing the circuit configuration shown below with the MLUTs is used for the MLUT 30*a* or 30*b* shown in FIG. 8.

A. Configuration of Logic Circuit

Figure 9:
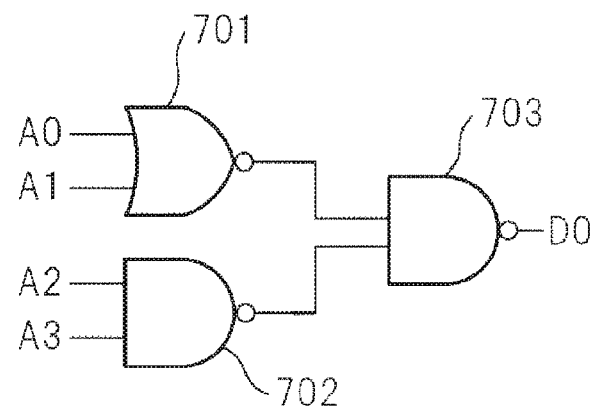
FIG. 9 is a diagram illustrating an example of the MLUT operating as a logic circuit.

FIG. 9 is a diagram illustrating an example of the MLUT operating as a logic circuit. In this example, the address input lines for logic A0 and A1 are taken as an input of a two-input NOR circuit 701, and the address input lines for logic A2 and A3 are taken as an input of a two-input NAND circuit 702. Then a logic circuit is configured in which the output of the two-input NOR circuit 701 and the output of the two-input NAND circuit 702 are inputted to a two-input NAND circuit 703, and the output of the two-input NAND circuit 703 is outputted to the data line for logical operation D0.

Figures 10, 11, 12:
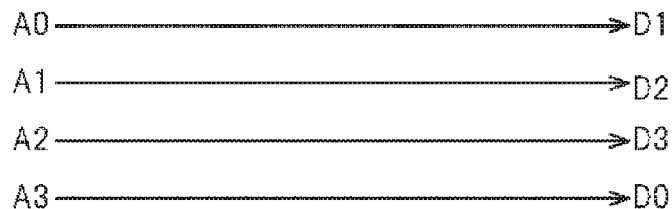
FIG. 10 is a diagram illustrating a truth table of the logic circuit of FIG. 9.
FIG. 11 is a diagram illustrating one example of the MLUT operating as a connection circuit.
FIG. 12 is a diagram illustrating a truth table of the connection circuit shown in FIG. 11.

FIG. 10 is a diagram illustrating a truth table of the logic circuit shown in FIG. 9. Since the logic circuit of FIG. 9 has four inputs, all the inputs of the inputs A0 to A3 are used as an input. On the other hand, since it has only one output, only the output D0 is used as an output. "*" is described in the columns of the outputs D1 to D3 of the truth table. This indicates that the column may be either "0" or "1". However, when truth table data is actually written to the MLUT for reconfiguration, it is necessary to write any value of "0" or "1" to these columns.

B. Configuration of Connection Circuit

FIG. 11 is a diagram illustrating an example of the MLUT operating as a connection circuit. In FIG. 11, the MLUT as a connection circuit operates to output a signal of the address input line for logic A0 to the data line for logical operation D1, output a signal of the address input line for logic A1 to the data line for logical operation D2, and output a signal of the address input line for logic A2 to the data line for logical operation D3. The MLUT as a connection circuit further operates to output a signal of the address input line for logic A3 to the data line for logical operation D0.

FIG. 12 is a diagram illustrating a truth table of the connection circuit shown in FIG. 11. The connection circuit shown in FIG. 11 has four inputs and four outputs. Therefore, all the inputs of the inputs A0 to A3 and all the outputs of the outputs D0 to D3 are used. According to the truth table shown in FIG. 12, the MLUT operates as a connection circuit that outputs a signal of the input A0 to the output D1, outputs a signal of the input A1 to the output D2, outputs a signal of the input A2 to the output D3, and outputs a signal of the input A3 to the output D0.

C. Configuration of Logic Circuit and Connection Circuit

Figures 13, 14:
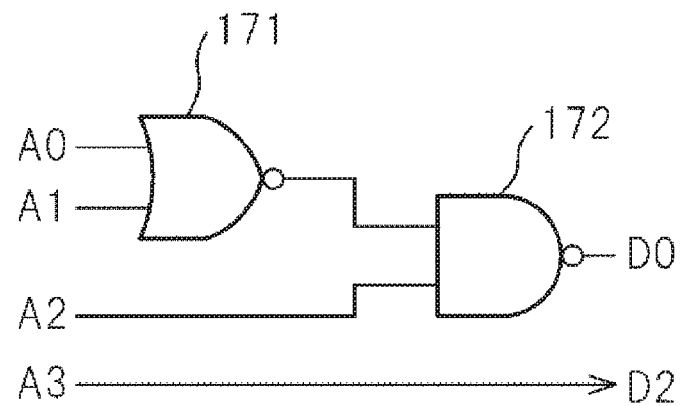
FIG. 13 is a diagram illustrating one example of one MLUT operating as a logic circuit and a connection circuit.
FIG. 14 is a diagram illustrating a truth table of the logic circuit and the connection circuit shown in FIG. 13.

FIG. 13 is a diagram illustrating an example where one MLUT operates as the logic circuit and the connection circuit. In the example shown in FIG. 13, the address input lines for logic A0 and A1 are taken as an input of a two-input NOR circuit 171, and the output of the two-input NOR circuit 171 and the address input line for logic A2 are taken as an input of a two-input NAND circuit 172. Then a logic circuit is configured in which the output of the two-input NAND circuit 172 is outputted to the data line for logical operation D0. At the same time, a connection circuit is configured in which a signal of the address input line for logic A3 is outputted to the data line for logical operation D2.

FIG. 14 illustrates a truth table of the logic circuit and the connection circuit of FIG. 13. The logical circuit of FIG. 13 uses three inputs of the inputs A0 to A3 and uses one output D0 as an output. On the other hand, the connection circuit is configured to output a signal of the input A3 to the output D2.

Heretofore, preferred embodiments of the present invention have been described in detail with reference to the appended drawings, but the present invention is not limited thereto. It should be understood by those skilled in the art that various changes and alterations may be made without departing from the spirit and scope of the appended claims.

What is claimed is:

1. A reconfigurable semiconductor device, comprising:
a plurality of circuits, wherein each circuit of the plurality of circuits comprises:
a reconfigurable logic unit; and
an analog circuit, wherein the analog circuit is configured to:
convert a first analog signal received from outside the analog circuit into a first digital signal and output the first digital signal to the reconfigurable logic unit; and
convert a second digital signal outputted from the reconfigurable logic unit into a second analog signal and output the second analog signal to the outside of the analog circuit,
wherein each circuit of the plurality of circuits is rectangular shaped,
wherein each circuit of the plurality of circuits is connected to first two adjacent circuits from a first side with a first plurality of analog lines and is connected to second two adjacent circuits from a second side with a second plurality of analog lines, wherein the second side is opposite to the first side.

2. The reconfigurable semiconductor device according to claim 1, wherein the analog circuit includes:
an A/D conversion circuit configured to convert the first analog signal into the first digital signal and output the first digital signal to the reconfigurable logic unit;
a D/A conversion circuit configured to convert the second digital signal outputted from the reconfigurable logic unit into the second analog signal and output the second analog signal; and
an operational amplifier arranged at an output of the D/A conversion circuit, wherein an analog line is a force line, wherein a first circuit of the plurality of circuits is connected to a second circuit of the plurality of circuits with the force line arranged at an output of the operational amplifier and connected to the second circuit with a sense line configured to feed back the second analog signal outputted from the force line to the operational amplifier, and wherein the first analog signal is inputted from the force line.

3. The reconfigurable semiconductor device according to claim 1, wherein the reconfigurable logic unit includes:
a memory cell unit configured to store configuration data; and
an address decoder configured to decode an address signal to output a decoded signal to the memory cell unit.

4. The reconfigurable semiconductor device according to claim 3, wherein each circuit of the plurality of circuits is further connected to the first two adjacent circuits from the first side with a first plurality of digital signal connection lines and connected to second two adjacent circuits from the second side with a second plurality of digital signal connection lines.

5. The reconfigurable semiconductor device according to claim 3, wherein address lines inputted to the address decoder included in a circuit of the plurality of circuits are connected to data lines of a memory cell included in an adjacent circuit, as digital signal connection lines.

6. The reconfigurable semiconductor device according to claim 1, wherein the reconfigurable logic unit is a field-programmable gate array (FPGA).

7. The reconfigurable semiconductor device according to claim 3, wherein the configuration data is truth table data, and the memory cell unit is configured to operate as a connection element or a logic element according to the truth table data.

8. A reconfigurable semiconductor device, comprising:
a plurality of circuit, wherein each circuit of the plurality of circuits comprises:
  a reconfigurable logic unit; and
  an analog circuit, wherein the analog circuit comprises:
    a A/D conversion circuit configured to convert a first analog signal received from outside the analog circuit into a first digital signal and output the first digital signal to the reconfigurable logic unit;
    a D/A conversion circuit configured to convert a second digital signal outputted from the reconfigurable logic unit into a second analog signal and output the second analog signal to the outside of the analog circuit; and
    an operational amplifier arranged at an output of the D/A conversion circuit,
wherein each circuit of the plurality of circuits is rectangular shaped, wherein each circuit of the plurality of circuits is connected to first two adjacent circuits from a first side with a first plurality of analog lines and is connected to second two adjacent circuits from a second side with a second plurality of analog lines, wherein the second side is opposite to the first side.

* * * * *